United States Patent
Ngo et al.

(10) Patent No.: US 6,613,657 B1
(45) Date of Patent: Sep. 2, 2003

(54) BPSG, SA-CVD LINER/P-HDP GAP FILL

(75) Inventors: Minh Van Ngo, Fremont, CA (US);
Dawn Hopper, San Jose, CA (US);
Wenmei Li, Sunnyvale, CA (US);
Kelwin King Wai Ko, San Jose, CA (US); Kuo-Tung Chang, Saratoga, CA (US); Tyagamohan Gottipati, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/231,133

(22) Filed: Aug. 30, 2002

(51) Int. Cl.[7] .......................................... H01L 21/8247
(52) U.S. Cl. ........................ 438/588; 438/594; 438/595
(58) Field of Search ................................. 438/257–267, 438/587–588, 593–594, 595

(56) References Cited

U.S. PATENT DOCUMENTS 6,444,554 B1 * 9/2002 Adachi et al. .............. 438/587
6,518,130 B1 * 2/2003 Ohno ......................... 438/275

* cited by examiner

*Primary Examiner*—Richard Booth

(57) ABSTRACT

Device leakage due to spacer undercutting is remedied by depositing a BPSG, SA-CVD oxide liner and flowing it into the undercut regions, followed by gap filling with a P-doped HDP oxide layer. Embodiments include depositing a BPSG, SA-CVD oxide liner containing 4 to 6 wt.% boron, at a thickness of 1,000 Å to 1,800 Å, over closely spaced apart non-volatile transistors and heating during or subsequent to deposition to flow the BPSG, SA-CVD oxide liner into the undercut regions of the sidewall spacers of the gate stacks. Gap filling is then completed by depositing the layer of P-doped HDP at a thickness of 6,000 Å to 10,000 Å.

12 Claims, 4 Drawing Sheets

BPSG, SA-CVD LINER/P-HDP GAP FILL

FIELD OF THE INVENTION

Various issues arise in attempting to satisfy the ever increasing demands for miniaturization, particularly in fabricating non-volatile semiconductor devices, such as flash memory devices, e.g., electrically erasable programmable read only memory (EEPROM) devices. The demands for continuing miniaturization have led to the fabrication of flash memory devices comprising transistors having a gate width of about 0.18 micron and under and very closely spaced apart gate structures. In accordance with conventional practices, an oxide sidewall spacer is formed on side surfaces of the gate stack and a conformal silicon nitride layer, serving as an etch stop layer, is deposited over the gate structures including the sidewall spacers, thereby further reducing the gap between gate structures to about 0.125 micron or less. In accordance with conventional practices, a first interlayer dielectric ($ILD_0$) is deposited over the gate structures and fills the gaps therebetween. Rapid thermal annealing is then conducted, as at a temperature of about 820° C. for about 120 seconds.

BACKGROUND ART

Various issues arise in attempting to satisfy the ever increasing demands for miniaturization, particularly in fabricating non-volatile semiconductor devices, such as flash memory devices, e.g., electrically erasable programmable read only memory (EEPROM) devices. The demands for continuing miniaturization have led to the fabrication of flash memory devices comprising transistors having a gate width of about 0.18 micron and under and very closely spaced apart gate structures. In accordance with conventional practices, an oxide sidewall spacer is formed on side surfaces of the gate stack and a conformal silicon nitride layer, serving as an etch stop layer, is deposited over the gate structures including the sidewall spacers, thereby further reducing the gap between gate structures to about 0.125 micron or less. In accordance with conventional practices, a first interlayer dielectric ($ILD_0$) is deposited over the gate structures and fills the gaps therebetween. Rapid thermal annealing is then conducted, as at a temperature of about 820° C. for about 120 seconds.

As the distance between sidewall spacers of neighboring gate structures, after depositing the etch stop layer decreases to below about 0.125 micron, it becomes extremely difficult to fill the gaps with a gap fill oxide, even after post deposition rapid thermal annealing, without void formation. Such voiding in ($ILD_0$) can lead to an open contact and shorting between contacts, thereby causing leakage and low production yields.

As miniaturization of flash technology proceeds apace, additional problems are encountered with respect to $ILD_0$ integrity as the aspect ratio of the gate stacks increases to about 3.0 and higher. It was found that undercutting of the sidewall spacers occurs, and even extends into the substrate surface. It is believed that such undercutting stems in part from undercutting of the oxide liner during wet cleaning with diluted hydrofluoric acid, such as hydrofluoric acid diluted with water at a level of 10:1 to 300:1, prior to metal deposition in implementing salicide technology. In addition, after silicidation, etching is conducted to remove unreacted metal remaining on the sidewall spacers, thereby attacking the silicon under the spacers, exacerbating the undercut regions. Attempts to deposit a phosphorous (P)-doped high density plasma (P-HDP) oxide layer as a gap fill layer have not been successful in filling these undercut regions, as such P-HDP oxide layers do not have sufficient fluidity. Consequently, the undercut regions remain as voids, thereby adversely impacting device reliability, as by facilitating boron penetration from the gate electrode through the gate oxide into the substrate, resulting in leakage upon rapid thermal annealing, as at a temperature of about 840° C. for about three minutes, during densification.

Accordingly, there exists a need for methodology enabling the fabrication of semiconductor devices, particularly flash memory devices, such as EEPROMs, with improved reliability. There exists a particular need for methodology enabling the fabrication of flash memory devices, such EEPROMs, with no or significantly reduced voids in the $ILD_0$ by enabling gap filling between neighboring transistors such that the undercut regions in sidewall spacers.

DISCLOSURE OF THE INVENTION

An advantage of the present invention is a method of manufacturing a semiconductor device exhibiting improved reliability.

Another advantage of the present invention is a method of manufacturing a flash memory semiconductor device with improved reliability.

A further advantage of the present invention is a method of manufacturing a flash memory device with reduced voids in the $ILD_0$ between closely spaced apart transistors and filled in undercut regions in sidewall spacers.

Another advantage of the present invention is a reliable semiconductor device having reduced leakage by virtue of oxide filled undercut regions in dielectric sidewall spacers on side surfaces of gate electrodes.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming two gate electrode structures, spaced apart by a gap, on a semiconductor substrate; forming dielectric sidewall spacers on side surfaces of the gate electrode structures with undercut regions at the substrate; depositing a boron (B) and phosphorus (P)-doped sub-atmospheric-chemical vapor deposition (BPSG, SA-CVD) oxide liner having sufficient fluidity to flow into the undercut regions; flowing the B-HDP oxide liner into the undercut regions; and depositing a phosphorous (P)-doped high density plasma (P-HDP) oxide layer filling the gap.

Another advantage of the present invention is a semiconductor device comprising: two gate electrode structures, spaced apart by a gap, on a semiconductor substrate; dielectric sidewall spacers on side surfaces of the gate electrode structures, the dielectric sidewall spacers having undercut regions at the substrate; a boron (B) and phosphorus (P)-doped sub-atmospheric-chemical vapor deposition (BPSG, SA-CVD) oxide liner on the gate electrode structures and filling the undercut regions; and a phosphorous (P)-doped high density plasma (P-HDP) oxide layer filling the gap.

Embodiments of the present invention comprise forming silicon oxide spacers as the dielectric sidewall spacers and forming a silicon nitride liner over the silicon oxide sidewall spacers, wherein the silicon nitride liner extends into the undercut regions. Embodiments of the present invention include depositing the BPSG, SA-CVD oxide liner at a thickness of 1,000 Å to 1,800 Å at a low deposition rate of about 6 Å/second or less, rapid thermal annealing at a temperature of about 700° C. to about 1,000° C. e.g., about 840° C. for about 1 minute or at less than 840° C. for about 2 minutes, and then depositing the P-HDP oxide layer at a thickness of about 6,000 Å to about 10,000 Å at a deposition rate of at least 40 Å/second to fill the gap. Embodiments of the present invention further include depositing the BPSG, SA-CVD oxide liner containing 4.0 to 6.0 wt.% B for sufficient fluidity and containing 4.0 to 6.0 wt.% P for gettering purposes.

Additional advantages of the present invention will become readily apparent to those skilled in this art from the following detailed description wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

In FIGS. 1 through 4, similar features or elements are denoted by similar reference characters.

DESCRIPTION OF THE INVENTION

The present invention addresses and solves various reliability problems attendant upon conventional semiconductor device fabrication techniques. The present invention provides efficient methodology enabling the fabrication of semiconductor devices exhibiting greater reliability. The present invention particularly addresses and solves device degradation problems stemming from the formation of undercut regions at the bottom of sidewall spacers formed on non-volatile gate electrodes, which undercut regions may extend into the substrate, thereby forming voids and facilitating B diffusion from the gate electrode through the tunnel oxide into the semiconductor substrate, resulting in undesirable leakage problems.

Figure 1:
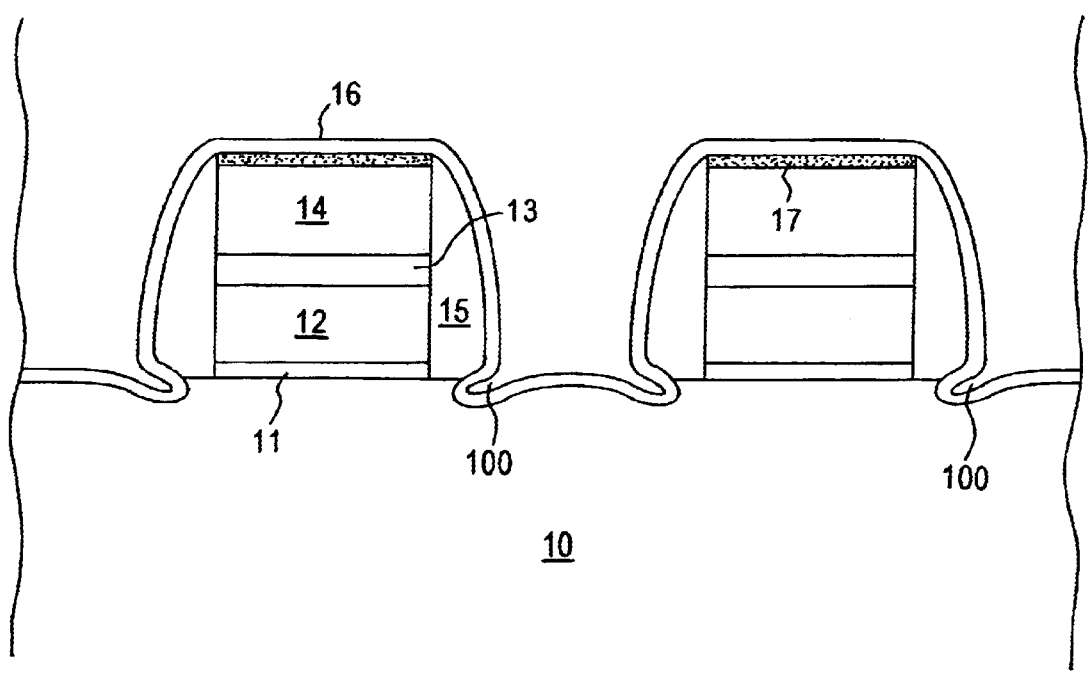
FIGS. 1 and 2 schematically illustrate the undercutting problem solved by the present invention.
Figure 2:
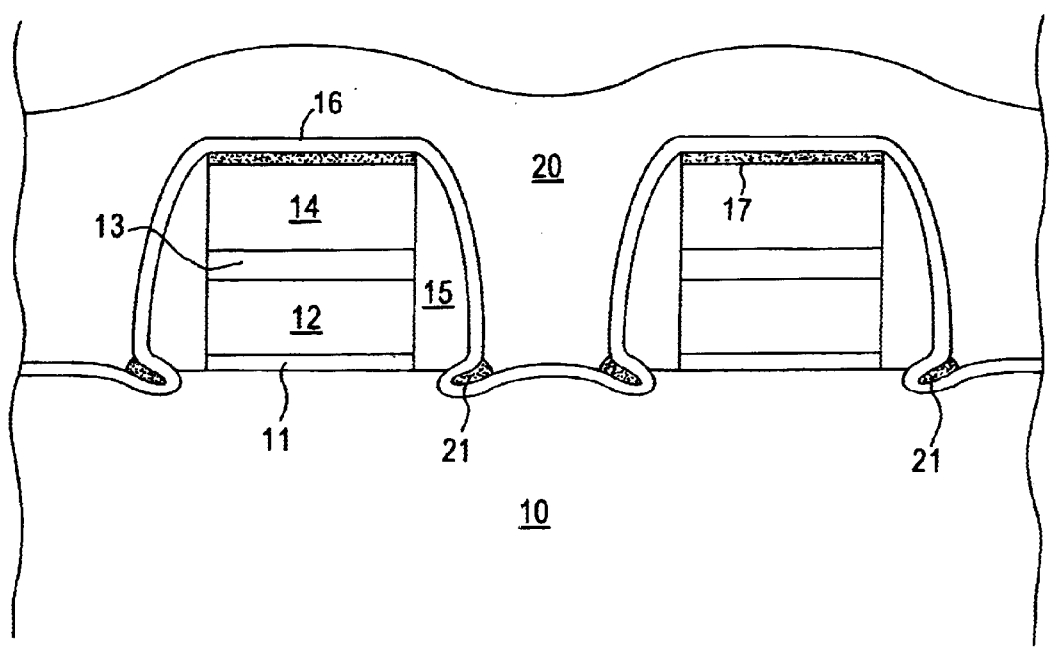

Adverting to FIG. 1 there are schematically illustrated closely spaced apart gate electrode stacks of non-volatile transistors formed on substrate 10. For illustrative convenience, the associated source/drain regions are not depicted. Each gate electrode stack comprises a tunnel oxide 11, a floating gate 12, a dielectric layer 13, such as a silicon oxide/silicon nitride/silicon oxide (ONO) layer, and a control gate electrode 14 formed thereon. Silicon oxide sidewall spacers 15 are formed on side surfaces of the gate electrode stacks. Prior to implementing salicide technology, wet cleaning is conventionally performed, as with dilute hydrofluoric acid, which attacks the silicon oxide sidewall spacers 15 resulting in undercutting. Such undercutting is exacerbated after metal silicidation during acid cleaning to remove unreacted metal from silicon oxide sidewall spacers 15, thereby extending the undercut regions into the semiconductor substrate as illustrated by reference character 100. Reference character 17 illustrates a metal silicide layer such as cobalt silicide or nickel silicide formed on control gate electrode 14. A metal silicide layer is also formed on the source/drain regions but not depicted for illustrative convenience. A silicon nitride liner 16 is then deposited over the gate electrode structures and extends into the undercut regions 100 but does not fill these regions. Upon subsequent deposition of gap fill $ILD_0$ 20, as illustrated in FIG. 2, voids 21 are generated because of the inability of the deposited oxide layer 20 to flow into and fill the undercut regions 100. The presence of such voids 21 adversely impacts device reliability and exacerbates B penetration from the gate electrodes into the substrate, thereby generating leakage issues. Such B penetration typically occurs during rapid thermal annealing at a temperature of about 840° C. for about 3 minutes.

The present invention addresses and solves such problems by providing methodology enabling gap filling and filling the undercut regions and further reducing the time required for rapid thermal annealing, thereby reducing boron penetration and, hence, further reducing leakage problems. In accordance with the embodiments of the present invention, an initial B and P-doped, sub-atmospheric-chemical vapor deposition (BPSG, SA-CVD) oxide liner is deposited over the gate electrode structures, which BPSG, SA-CVD oxide liner contains a sufficient amount of B, e.g., 4.0 to 6.0 wt.% B, such that it exhibits sufficient fluidity to flow into and fill the undercut regions. In embodiments of the present invention, the BPSG, SA-CVD oxide liner may advantageously contain 4.0 to 6.0 wt.% of P for gettering purposes. Advantageously, the B-HDP oxide liner is deposited at a slow deposition rate, as at about 6.5 Å/second or less, thereby enhancing complete filling of the narrow gaps between the gate electrode structures. Rapid thermal annealing may then be conducted as at a temperature of about 840° C. for about 1 minute or less than 840° C. for about 2 minutes. A phosphorus (P)-doped high density plasma (P-HDP) oxide layer is then deposited at a desirably higher deposition rate of about 40 Å/second or greater, for gap filing at enhanced throughput.

The BPSG, SA-CVD oxide liner is advantageously deposited at a low deposition rate of 6.5 Å/second for a minute or less at a thickness of 1,000 Å to 1,800 Å, e.g., about 1,500 Å. The presence of 4.0 wt.% boron in the BPSG, SA-CVD oxide liner provides sufficient fluidity at the rapid thermal annealing temperature of about 840° C. so that the BPSG, SA-CVD oxide liner flows into and fills the undercut regions rapidly, thereby reducing B penetration and reducing leakage problems. In another embodiment of the present invention, the temperature during BPSG, SA-CVD oxide liner deposition may be increased to 500° C. to 600° C. thereby enabling filling of the undercut regions during deposition. Optionally, an additional rapid thermal annealing can be performed to further enhance to ensure complete filling of the undercut regions, as at a temperature of about 840° C. for 1 minute.

Embodiments of the present invention comprise depositing the B-HDP oxide liner at a deposition rate of no greater than 6.5 Å/second, a pressure of 580 to 600 Torr, a temperature of 460° C. to 550° C. a spacing (distance between the wafer and shower head) of 240 to 270 mils., an ozone ($O_3$) flow rate of 3,000 to 5,000 sccm, a helium (He) flow rate of 5,000 to 7,000 sccm, a tetraethyl orthosilicate (TEOS) flow rate of 100 to 160 sccm, a triethylphosphate (TEPO) flow rate of 15 to 30 sccm, and a triethylborate (TEB) flow rate of 30 to 60 sccm. Subsequent to deposition, rapid thermal annealing may be conducted as at a temperature of about 700° C. to about 1,000° C. e.g., about 840° C. for about 1 minute, to flow the BPSG, SA-CVD oxide into the undercut regions. The P-HDP oxide layer is then deposited at a deposition rate of 40 Å/second or greater, at a phosphine ($PH_3$) flow rate of 20 to 40 sccm, a silane ($SiH_4$) flow rate of 90 to 130 sccm, an oxygen ($O_2$) flow rate of 200 to 270 sccm, a helium (He) flow rate of 400 to 600 sccm, and a temperature of 500° C. to 700° C.

Figure 3:
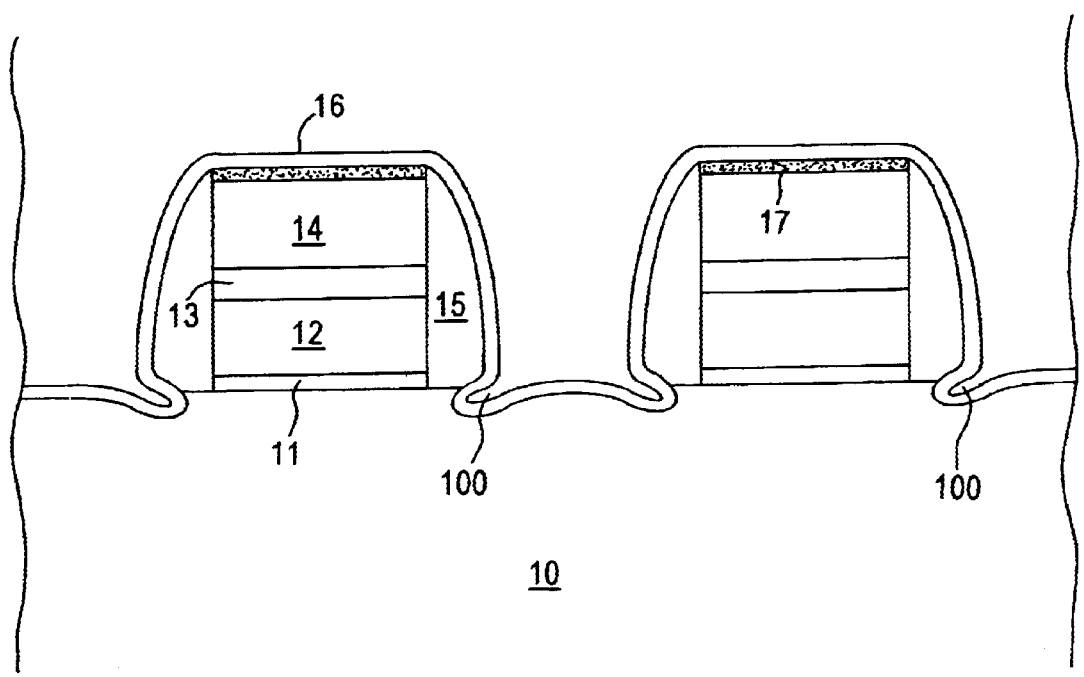
FIGS. 3 and 4 schematically illustrate sequential phases of a method in accordance with an embodiment of the present invention.
Figure 4:
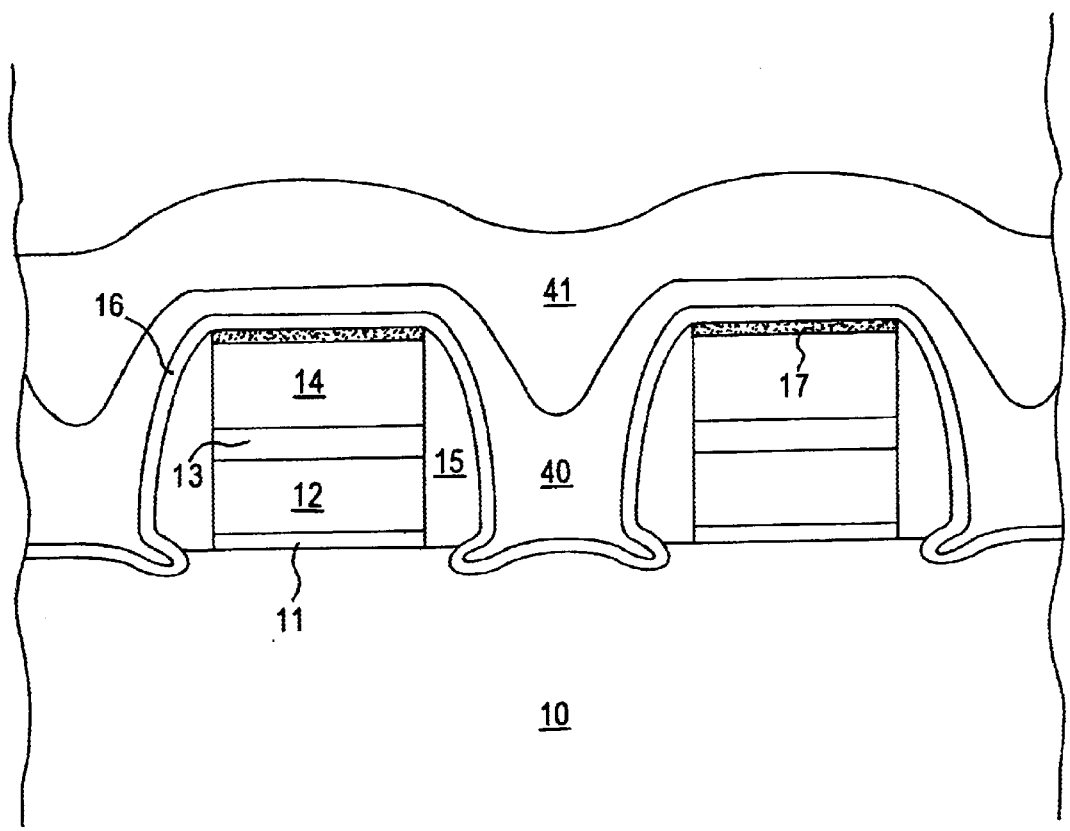

An embodiment of the present invention is schematically illustrated in FIGS. 3 and 4. As schematically shown in FIG. 3, which substantially corresponds to FIG. 1, processing is conducted in a conventional manner to form an intermediate structure comprising substrate 10 with transistors thereon, such as MOS transistors and/or dual gate structures with an (ONO) dielectric therebetween. For example, the transistors can comprise tunnel oxide 11, a floating gate electrode 12, an ONO stack dielectric 13, and a control gate 14. Silicon oxide sidewall spacers 15 are formed on side surfaces of the gate electrode stacks. During wet cleaning prior to metal deposition for implementing salicide technology, silicon oxide sidewall spacers 15 are attacked forming an undercut region. Subsequent to silicidation, unreacted metal remaining on silicon oxide sidewall spacers 15, such as cobalt or nickel, is removed, as by wet etching with a mixture of hydrochloric acid or sulfuric acid and hydrogen peroxide. During such wet etching, the underlying silicon in substrate 10 is attacked, thereby extending the undercut regions into the substrate. The silicon nitride liner 16 is then deposited leaving undercut regions 100. Reference numeral 17 schematically illustrates a metal silicide layer formed on control gate electrode 14. For illustrative convenience, the source/drain and silicide layers formed thereon are not shown. Typically, each gate has a width of about 0.18 micron or less, and the spacing between gates electrodes is typically about 0.17 micron or less, e.g., about 0.125 micron or less.

Adverting to FIG. 4, in accordance with an embodiment of the present invention, a BPSG, SA-CVD oxide liner 40 is deposited at a low deposition rate of 6 Å/second or less followed by rapid thermal annealing, as at a temperature of about 840° C. for about minute, to flow the BPSG, SA-CVD oxide liner into and fill the undercut portions 100 (FIG. 3). Advantageously, by incorporating at least 4 wt.% of B, the initial B-HDP oxide liner exhibits sufficient fluidity to not only fill narrow gaps of about 0.125 micron or less, but also to flow into and fill the undercut regions which can extend to a distance of about 20 Å to 100 Å. BPSG, SA-CVD oxide liner 40 is typically deposited at a thickness of about 1,000 Å to about 1,800 Å, e.g., 1,500 Å. After thermal annealing, P-HDP layer 41 is deposited at a relatively rapid deposition rate of at least 40 Å/second, thereby filling the gaps serving as a capping layer which, together with B-HDP oxide liner 40 constitutes the $ILD_0$. The P-HDP oxide layer typically contains about 4.0 to 6.0 wt.% P and is deposited at a thickness of about 6,000 Å to 10,000 Å.

The present invention provides enabling methodology for fabricating semiconductor devices, particularly flash memory devices with a gate width of no greater than about 0.13 micron and under and gaps of about 0.33 micron or under, with significantly reduced $ILD_0$ voiding by strategically implementing an initial low deposition rate gap filling stage. In accordance with embodiments of the present invention, an initial BPSG, SA-CVD oxide liner is deposited with sufficient fluidity to flow into undercut regions in the base of the silicon oxide sidewall spacers and into the silicon substrate upon rapid thermal annealing at a temperature of about 840° C. for about 1 minute or at a temperature less than 840° C. for 2 minutes. This aspect significantly reduces the voids in $ILD_0$ and significantly reduces B penetration during rapid thermal annealing from the gate electrodes into the semiconductor substrate through the tunnel oxide. The subsequent rapid deposition of a P-HDP oxide layer reduces the cycle time and, thereby, increases manufacturing throughput. The present invention may also be employed to eliminate voids in oxide layers during various phases of semiconductor fabrication.

The present invention enjoys industrial applicability in manufacturing various types of semiconductor devices, particularly highly integrated semiconductor devices exhibiting increased circuit speed and sub-micron dimensions, e.g., with a design rule of about 0.12 micron and under, with high reliability. The present invention enjoys particular industrial applicability in manufacturing flash memory devices, such as EEPROMs.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:
   forming two gate electrode structures, spaced apart by a gap, on a semiconductor substrate;
   forming dielectric sidewall spacers on side surfaces of the gate electrode structures with undercut regions at the substrate;
   depositing a boron (B) and phosphorus (P)-doped sub-atmospheric chemical vapor deposition (BPSG, SA-CVD) oxide liner having sufficient fluidity to flow into the undercut regions;
   flowing the BPSG, SA-CVD oxide liner into the undercut regions; and
   depositing a phosphorous (P)-doped high density plasma (P-HDP) oxide layer filling the gap.

2. The method according to claim 1, comprising:
   forming silicon oxide spacers as the dielectric sidewall spacers; and
   forming a silicon nitride liner over the silicon oxide sidewall spacers, wherein the silicon nitride liner extends into the undercut regions.

3. The method according to claim 2, comprising:
   depositing the BPSG, SA-CVD oxide liner at a thickness of 1,000 Å to 1,800 Å; and
   depositing the P-HDP oxide layer at a thickness of 6,000 Å to 10,000 Å.

4. The method according to claim 2, comprising:
   heating at a temperature of 500° C. to 600° C. during deposition of the BPSG, SA-CVD oxide liner to flow the BPSG, SA-CVD oxide liner into the undercut regions; or heating at a temperature of 700° C. to 1,000° C. after depositing the BPSG, SA-CVD oxide liner to flow the BPSG, SA-CVD oxide liner into the undercut regions.

5. The method according to claim 2, comprising depositing the BPSG, SA-CVD oxide liner with a B content of 4.0 to 6.0 wt.% B.

6. The method according to claim 5, wherein the BPSG, SA-CVD oxide liner is doped with 4.0 to 6.0 wt.% P.

7. The method according to claim 6, comprising depositing the BPSG, SA-CVD oxide liner at a deposition rate of 6.5 Å/second or less.

8. The method according to claim 7, comprising:
depositing the BPSG, SA-CVD oxide liner at:
a pressure of 580 to 600 Torr;
a temperature of 460° C. to 550° C.;
a spacing of 240 to 270 mil.;
an ozone ($O_3$) flow rate of 3,000 to 5,000 sccm;
a helium (He) flow rate of 5,000 to 7,000 sccm;
a tetraethyl orthosilicate (TEOS) flow rate of 140 to 160 sccm;
a triethylphosphate (TEPO) flow rate of 20 to 24 sccm; and
a triethylborate (TEB) flow rate of 40 to 60 sccm; and
heating the deposited BPSG, SA-CVD oxide liner at a temperature of 700° C. to 1,000° C. to flow the BPSG, SA-CVD oxide liner into the undercut regions.

9. The method according to claim 8, comprising depositing the P-HDP oxide layer at a:
a phosphine ($PH_3$) flow rate of 20 to 40 sccm;
silane ($Si_4$) flow rate of 90 to 130 sccm;
oxygen ($O_2$) flow rate of 200 to 270 sccm;
helium (He) flow rate of 400 to 600 sccm;
temperature of 500° C. to 700° C.; and
deposition rate of about 40 Å/second or higher.

10. The method according to claim 1, where:
each gate electrode structure comprises a gate stack comprising:
a tunnel oxide on the semiconductor substrate;
a floating gate electrode on the tunnel oxide;
a dielectric layer on the floating gate electrode; and
a control gate electrode on the dielectric layer, wherein the dielectric sidewall spacers comprise silicon oxide; and
a silicon nitride liner is formed over each gate electrode structure and the silicon oxide sidewall spacers.

11. The method according to claim 1, wherein the undercut regions extend to a distance of about 20 Å to about 100 Å.

12. The method according to claim 1, wherein the undercut regions extend in to the substrate.

* * * * *